(12) United States Patent
Wang

(10) Patent No.: US 10,369,648 B2
(45) Date of Patent: Aug. 6, 2019

(54) GUIDING BOARD FOR A BALL PLACEMENT MACHINE

(71) Applicant: HORNG TERNG AUTOMATION CO., LTD., Kaohsiung (TW)

(72) Inventor: Eric Wang, Kaohsiung (TW)

(73) Assignee: HORNG TERNG AUTOMATION CO., LTD., Kaohsiung (TW)

( * ) Notice: Subject to any disclaimer, the term of this patent is extended or adjusted under 35 U.S.C. 154(b) by 149 days.

(21) Appl. No.: 15/405,740

(22) Filed: Jan. 13, 2017

(65) Prior Publication Data

US 2018/0200820 A1    Jul. 19, 2018

(51) Int. Cl.

| B23K 3/06 | (2006.01) |
|---|---|
| H01L 23/00 | (2006.01) |
| H05K 3/40 | (2006.01) |
| H05K 3/34 | (2006.01) |
| B23K 101/40 | (2006.01) |

(52) U.S. Cl.
CPC ............ B23K 3/0623 (2013.01); H01L 24/75 (2013.01); H05K 3/3478 (2013.01); H05K 3/4015 (2013.01); *B23K 2101/40* (2018.08); *H01L 2224/75755* (2013.01); *H05K 2201/10734* (2013.01); *H05K 2203/041* (2013.01)

(58) Field of Classification Search
CPC .............. B23K 2201/40; B23K 3/0623; H01L 2224/75755; H01L 24/75; H05K 3/4015
See application file for complete search history.

(56) References Cited

U.S. PATENT DOCUMENTS

| 5,431,332 A | * | 7/1995 | Kirby .................... B23K 1/20 |
|---|---|---|---|
| | | | 118/213 |
| 5,680,984 A | * | 10/1997 | Sakemi ................ B23K 3/0623 |
| | | | 118/425 |
| 5,782,399 A | * | 7/1998 | Lapastora ........... H01L 21/4853 |
| | | | 156/556 |
| 5,839,641 A | * | 11/1998 | Teng .................... B23K 3/0623 |
| | | | 228/41 |

(Continued)

FOREIGN PATENT DOCUMENTS

| CN | 101276759 | 10/2012 |
|---|---|---|
| JP | 53-29144 | 8/1978 |

(Continued)

OTHER PUBLICATIONS

English Abstracts for JP53-29144, JP60-24268, and TWI518315, Total of 3 pages.

(Continued)

*Primary Examiner* — Erin B Saad
*Assistant Examiner* — Carlos J Gamino
(74) *Attorney, Agent, or Firm* — Lynette Wylie; Apex Juris, PLLC.

(57) ABSTRACT

A guiding board for a ball placement machine has a board body. The board body has a top surface, a bottom surface, a ball-dropping area, and multiple guiding grooves. The ball-dropping area is defined on the top surface. The guiding grooves are defined in the ball-dropping area and are parallel to each other. Each guiding groove has a bottom and multiple ball-dropping holes defined in the bottom and extending through the bottom surface of the board body.

6 Claims, 10 Drawing Sheets

(56) References Cited

U.S. PATENT DOCUMENTS

| | | | | |
|---|---|---|---|---|
| 6,182,356 B1 * | 2/2001 | Bolde | ............... | B23K 3/0623 228/41 |
| 6,253,992 B1 * | 7/2001 | Fjelstad | ............ | B23K 3/0623 228/245 |
| 6,390,351 B1 * | 5/2002 | Kasai | ............... | B23K 3/0623 228/246 |
| 6,533,160 B1 * | 3/2003 | Bourrieres | .......... | H01L 21/4853 228/245 |
| 6,604,673 B1 * | 8/2003 | Bourrieres | .......... | B23K 3/0607 228/246 |
| 6,769,599 B1 * | 8/2004 | Momeni | ............ | B23K 1/0056 219/121.66 |
| 7,946,470 B2 * | 5/2011 | Huth | ................ | H05K 3/3478 228/180.22 |
| 9,120,170 B2 * | 9/2015 | Lee | ................... | B23K 3/0623 |
| 2002/0058406 A1 * | 5/2002 | Mukuno | ............ | B23K 3/0623 438/626 |
| 2003/0127501 A1 * | 7/2003 | Cheng | ................ | B23K 3/0623 228/246 |
| 2010/0288818 A1 * | 11/2010 | Kim | ................... | B23K 3/0623 228/41 |
| 2015/0231723 A1 * | 8/2015 | An | ....................... | B23K 3/082 228/41 |

FOREIGN PATENT DOCUMENTS

| | | | | |
|---|---|---|---|---|
| JP | 60-24268 | | 2/1985 | |
| KR | 101376888 B1 * | | 3/2014 | ............. B23K 3/06 |
| TW | 201412212 | | 3/2014 | |
| TW | I518815 | | 1/2016 | |

OTHER PUBLICATIONS

Abstract for TW201412212, Total of 1 page.
Abstract for CN101276759, Total of 1 page.

* cited by examiner

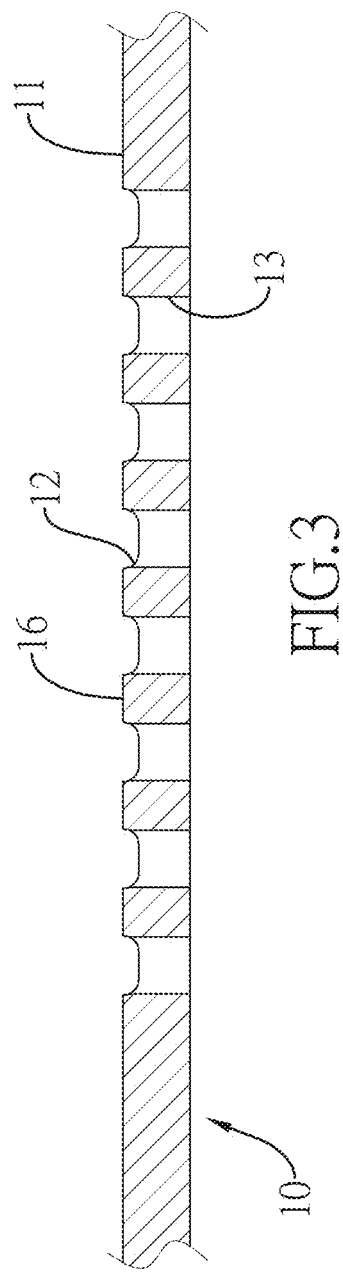
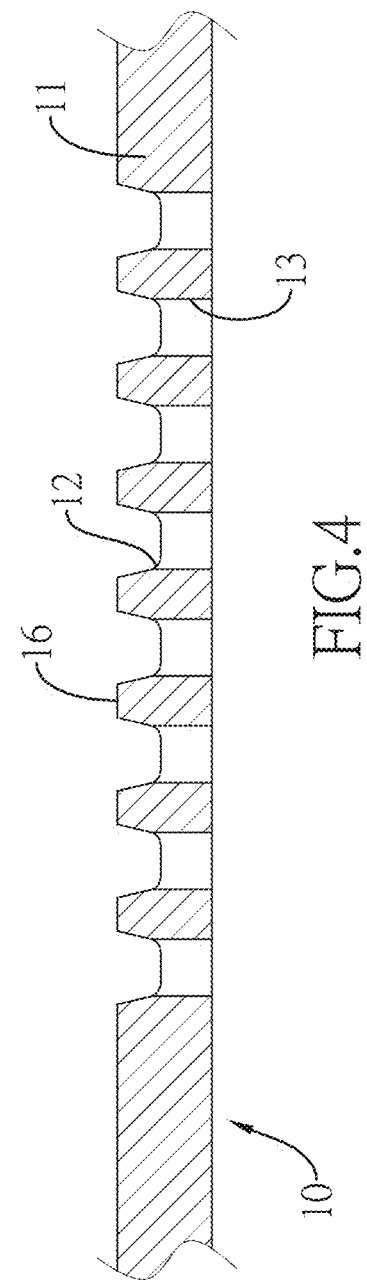

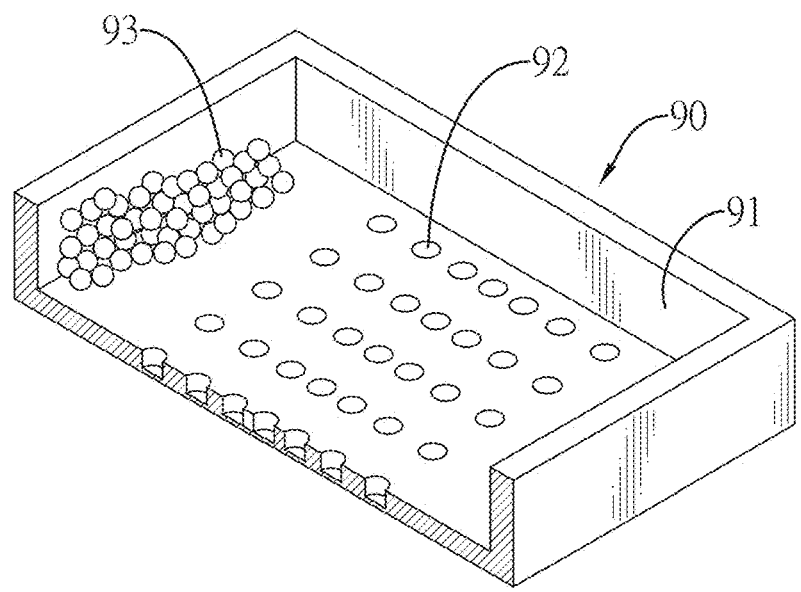
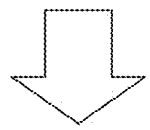
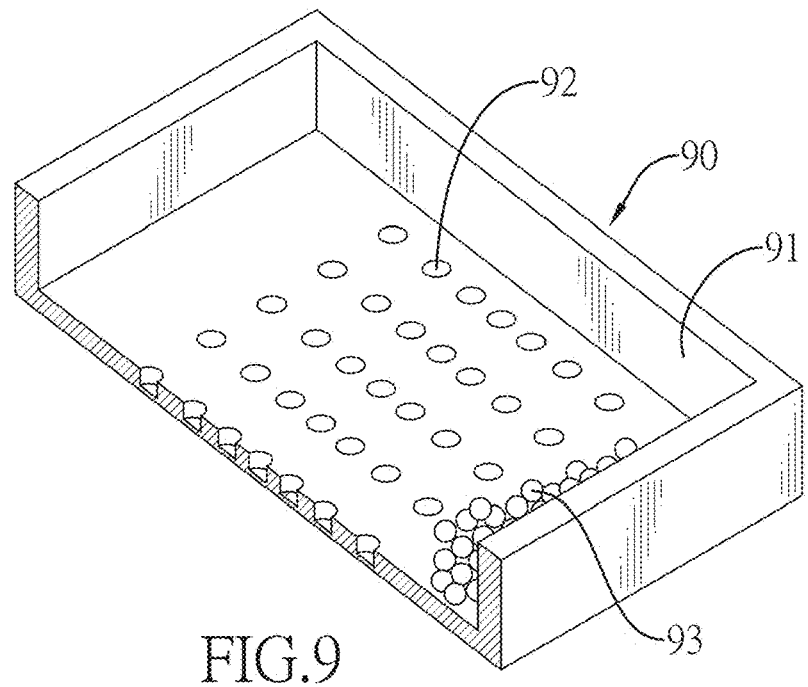
FIG.9
PRIOR ART

GUIDING BOARD FOR A BALL PLACEMENT MACHINE

BACKGROUND OF THE INVENTION

1. Field of the Invention

The present invention relates to a guiding board, and more particularly to a guiding board for a ball placement machine.

2. Description of Related Art

Ball grid array (BGA) is a packaging technique for mounting connecting pinson electronic devices that are reduced in size. A BGA electronic device comprises multiple conducting balls arranged in an array on a surface of the electronic device to replace conventional connecting pins. Accordingly, the volume of the electronic device can be reduced, and the electrical connection performance of the electronic device can be improved.

To form a BGA package, a screen printing or a ball placing technique is applied. The ball placing technique includes pick-and-place technique and printing technique to place multiple balls onto ball bases on a substrate. With reference to FIG. 9, a conventional ball placement device 90 comprises a ball case 91. The ball case 91 has multiple holes 92 defined in a bottom of the ball case 91. Multiple conducting balls 93 are held in the ball case 91. When the ball case 91 is shaken horizontally, the conducting balls 93 will drop into the holes 92. The conducting balls 93 in the holes 92 can be taken out of the ball case 91 by a suction device and are moved above multiple ball bases on a substrate. When the suction force provided by the suction device is off, the conducting balls 93 will drop into the ball bases. Accordingly, the ball placement process is completed.

With reference to FIG. 10, another conventional ball placement device 80 comprises a suction device 81, a ball case 83, and a placement board 84. The suction device 81 has multiple suction holes 82. The ball case 83 holds multiple conducting balls 87 inside and has a bottom and a bottom opening defined through the bottom. The bottom of the ball case 83 is moveably attached to and abuts the top of the placement board 84. The placement board 84 has multiple ball holes 85 defined through the placement board 84. Each ball hole 85 has an enlarged mouth 86 formed in a top of the ball hole 85. While the ball case 83 is moved relative to the placement board 84, the conducting balls 87 will drop into the ball holes 85 in the placement board 84 via the bottom opening of the ball case 83. The suction device 81 will suck and pick the conducting balls 89 in the ball holes 85 to ball bases on a substrate. When the suction force provided by the suction device 81 is off, the conducting balls 87 will drop into the ball bases. Accordingly, the ball placement process is completed.

With reference to FIGS. 11 and 12, a conventional ball placement device 70 for the printing technique comprises a ball case 71, a cover 72, and a substrate 73. The ball case 71 has a bottom and a bottom opening 74 defined through the bottom. The cover 72 is attached to the bottom of the ball case 71 and has multiple through holes 75 defined through the cover 72. The substrate 73 is attached to a bottom of the cover 72 and has multiple ball bases 76. Multiple conducting balls 77 are held in the ball case 71. While the ball case 71 is moved relative to the cover 72, the conducting balls 77 will drop into the ball bases 76 via the bottom opening 74 in the ball case 71 and the through holes 76 in the cover 72. After removal of the ball case 71 and the cover 72, the ball placement process is completed.

Alternatively, multiple conducting balls 77 are put on the cover 72 and are swept into the ball bases 76 on the substrate 73 via the through holes 75 in the cover 72 by a brush. In addition, the conducting balls 77 may be moved into the ball bases 76 by a pneumatic power, by inclining or shaking the cover 72.

However, the aforementioned manners of ball placement are unstable. Whether the conducting balls 77,87,93 enter the holes 75,85,92 or the ball bases 76 or not is determined by probability. The conducting balls 77,87,93 will not enter the holes 75,85,92 due to the pushes or bumps between the conducting balls 77,87,93 or external forces. Consequently, some of the holes 75,85,92 are free of the conducting balls 77,87,93, so some of the ball bases 76 corresponding to the holes 75,85,92 are also free of the conducting balls 77,87,93. In addition, in the manners of taking the conducting ball by the suction device, some of the suction holes in the suction device may not suck and take the conducting balls due to probability. Thus, some of the ball bases on a substrate may be free of conducting balls.

To overcome the shortcomings, the present invention tends to provide a guiding board for a ball placement machine to mitigate or obviate the aforementioned problems.

SUMMARY OF THE INVENTION

The main objective of the invention is to provide a guiding board for a ball placement machine to prevent the occurrence that some of the ball bases on a substrate are free of conducting balls.

The guiding board has a board body. The board body has a top surface, a bottom surface, a ball-dropping area, and multiple guiding grooves. The ball-dropping area is defined on the top surface. The guiding grooves are defined in the ball-dropping area and are parallel to each other. Each guiding groove has a bottom and multiple ball-dropping holes defined in the bottom and extending through the bottom surface of the board body.

Other objects, advantages and novel features of the invention will become more apparent from the following detailed description when taken in conjunction with the accompanying drawings.

BRIEF DESCRIPTION OF THE DRAWINGS

FIG. 3 is an enlarged cross sectional side view of the guiding board in FIG. 1;

FIG. 4 is a cross sectional side view of another embodiment of a guiding board in accordance with the present invention;

FIG. 9 shows operational perspective views of a conventional ball placement device;

DETAILED DESCRIPTION OF PREFERRED EMBODIMENT

Figure 1:
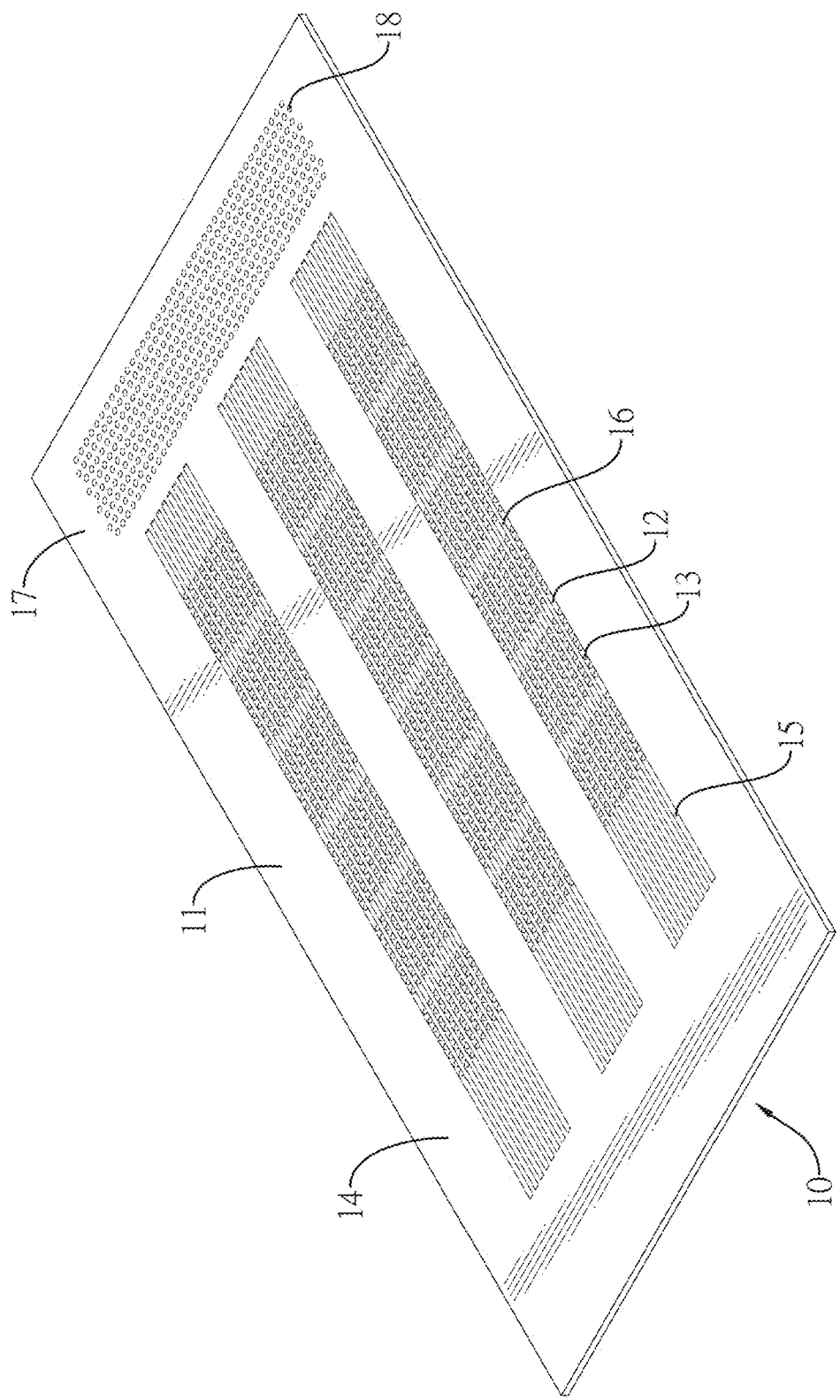
FIG. 1 is a perspective view of a guiding board in accordance with the present invention.
Figure 2:
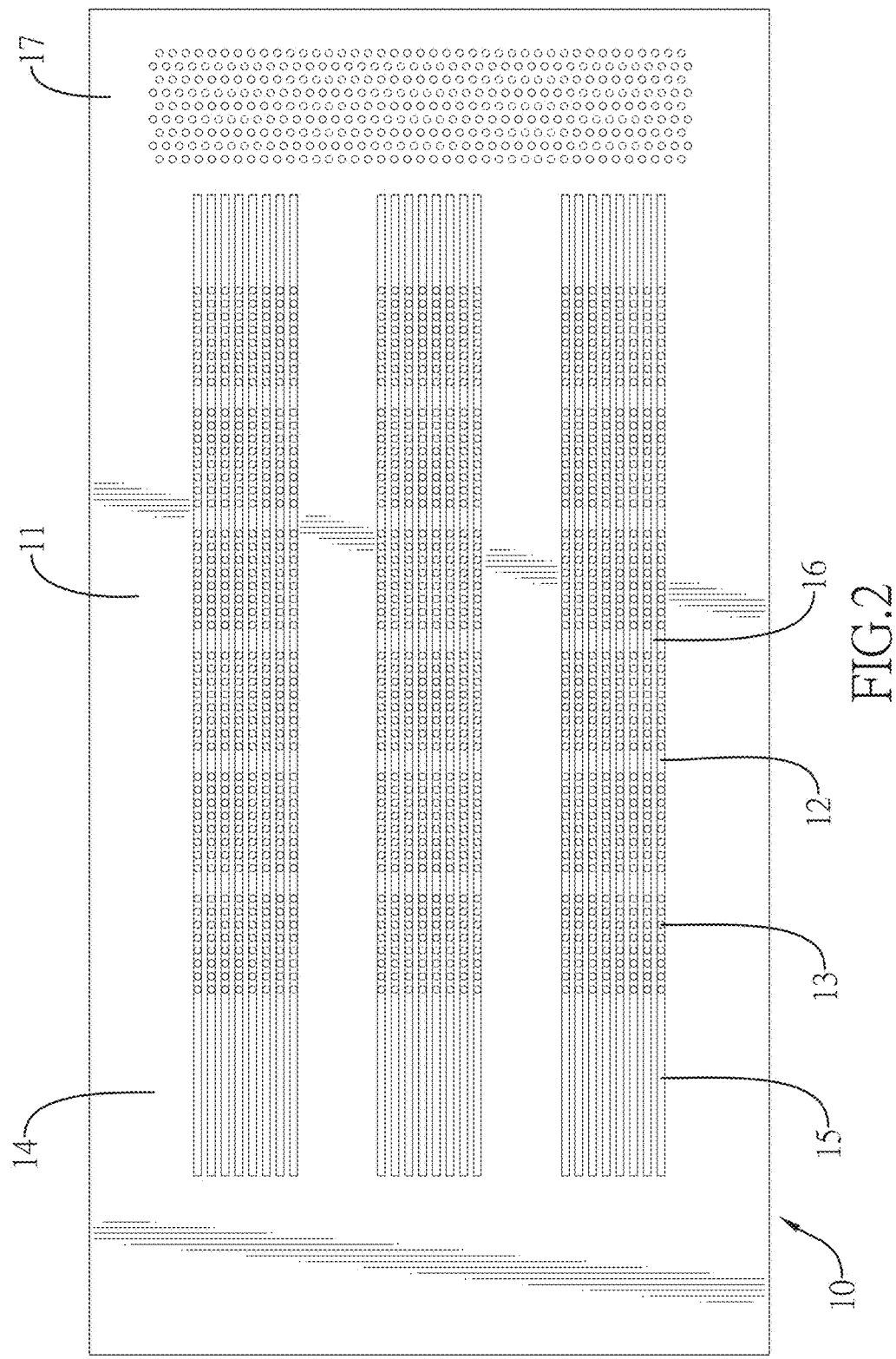
FIG. 2 is a top view of the guiding board in FIG. 1.

With reference to FIGS. 1 to 3, a guiding board for a ball placement machine in accordance with the present invention comprises a board body 10. The board body 10 has a top surface, a bottom surface, a ball-dropping area 11, multiple guiding grooves 12, a ball-collecting area 14, and a retrieval area 17. The ball-dropping area 11 is defined on the top surface. The guiding grooves 12 are defined in the ball-dropping area 11 and are parallel to each other. Each guiding groove 11 has a bottom and multiple ball-dropping holes 13 defined in the bottom of the guiding groove 12 and extending through the bottom surface of the board body 10.

The ball-collecting area is 14 defined on the top surface of the board body 10 and is located at a position being adjacent to a front end of the ball-dropping area 11. Multiple collecting grooves 15 are defined in the ball-collecting area 14 and are aligned and communicate with the multiple guiding grooves 12 respectively.

In addition, a distance defined between the bottom of each guiding groove 12 and the bottom surface of the board body 10 is smaller than a distance between the top surface and the bottom surface of the board body 10.

With reference to FIG. 4, in another embodiment, the board body 10 further has multiple elongated protrusions 16 formed on and protruding from the top surface of the board body 10, being parallel to each other, and located respectively between adjacent two of the guiding grooves 12.

Additionally, the cross section of each guiding groove 12 may be curved, U-shaped, V-shaped, rectangular or inverted trapezoidal.

The retrieval area 17 is defined on the top surface of the board body 10 at a position being adjacent to a rear end of the ball-dropping area 11 opposite the ball-collecting area 14. Multiple ball-retrieval holes 18 are defined in the retrieval area 17 and are formed through the top surface and the bottom surface of the board body 10.

Figure 5:
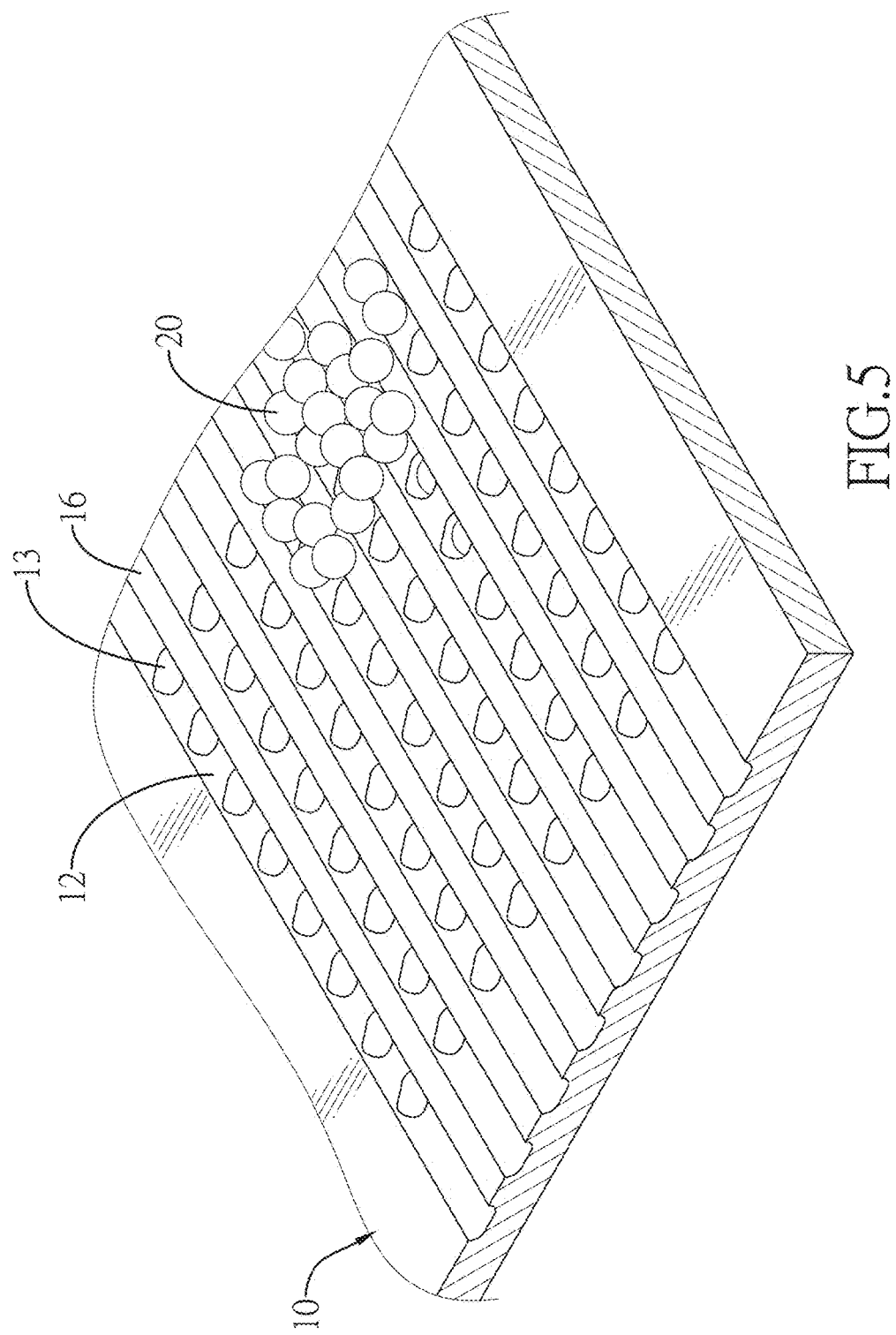
FIG. 5 is an enlarged operational perspective view of the guiding board in FIG. 1.
Figure 6:
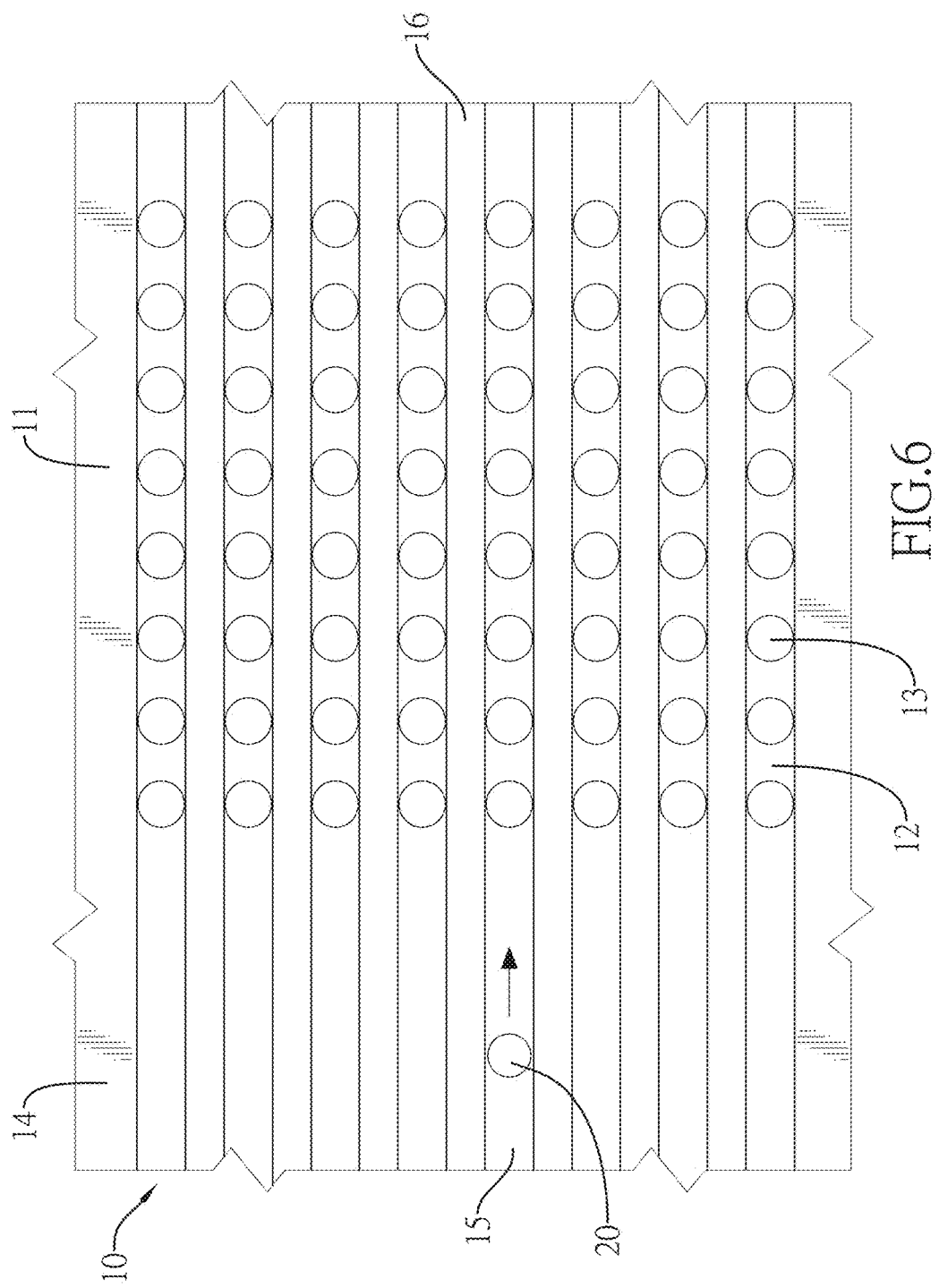
FIG. 6 is an enlarged operational top view of the guiding board in FIG. 1.
Figure 7:
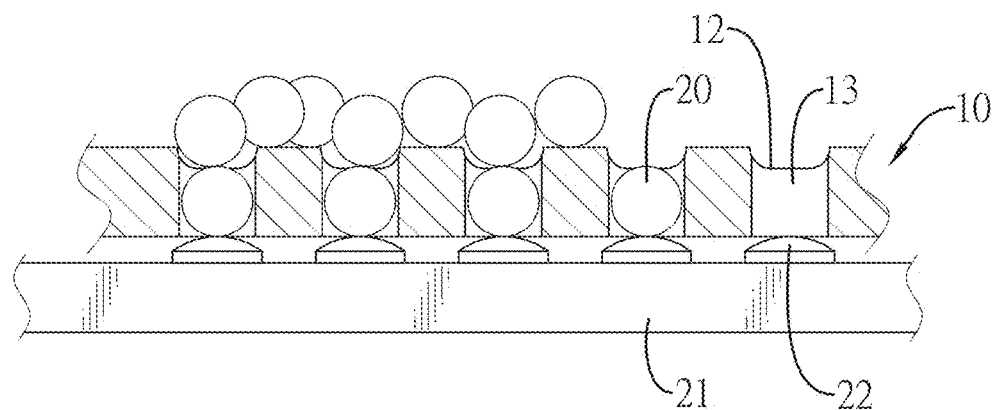
FIG. 7 is an enlarged operational side view in partial section of the guiding board in FIG. 1.

With reference to FIGS. 5 to 7, when the guiding board is applied to a printing technique, the board body 10 is attached to a substrate 21 having multiple ball bases 22. A ball case holding conducting balls 20 is moveably attached to the top surface of the board body 10. The conducting balls 20 fall onto the top surface of the board body 10 via the bottom opening of the ball case. The conducting balls 20 will enter the collecting grooves 15 in the ball-collecting area 14. With the movement of the ball case relative to the board body 10, the conducting balls 20 will enter the guiding grooves 12 from the collecting grooves 15. Consequently, the conducting balls 20 will enter respectively the ball-dropping holes 13 in the bottoms of the guiding grooves 12. In this embodiment, the diameters of the ball-dropping holes 13 are larger than the diameters of the conducting balls 20. Thus, the conducting balls 20 will drop into the ball bases 22 on the substrate 21 via the ball-dropping holes 13. With the collection effect provided by the collecting grooves 15 and the guiding effect provide by the guiding grooves 12, each ball-drooping hole 13 is actually provided with a conducting ball 20. In addition, the conducting ball 20 may be moved into the ball-dropping holes 13 by a brush, pneumatic power, inclining or shaking the board body 10.

With reference to FIG. 1, when all of the ball-dropping holes 13 are provided with conducting balls 20, the surplus conducting balls 20 will be moved to the retrieval area 17 and fall into the ball-retrieval holes 18. Accordingly, the conducting balls 20 in the ball-retrieval holes 18 can be retrieved for use.

Figure 8:
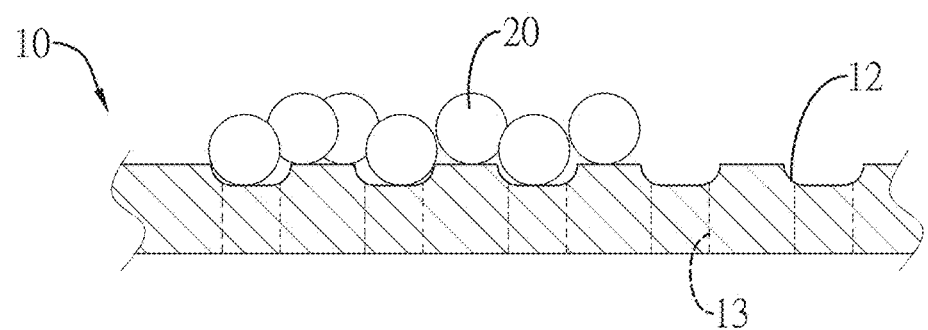
FIG. 8 is another enlarged operational side view in partial section of an alternative embodiment of a guiding board in accordance with the present invention.
Figure 10:
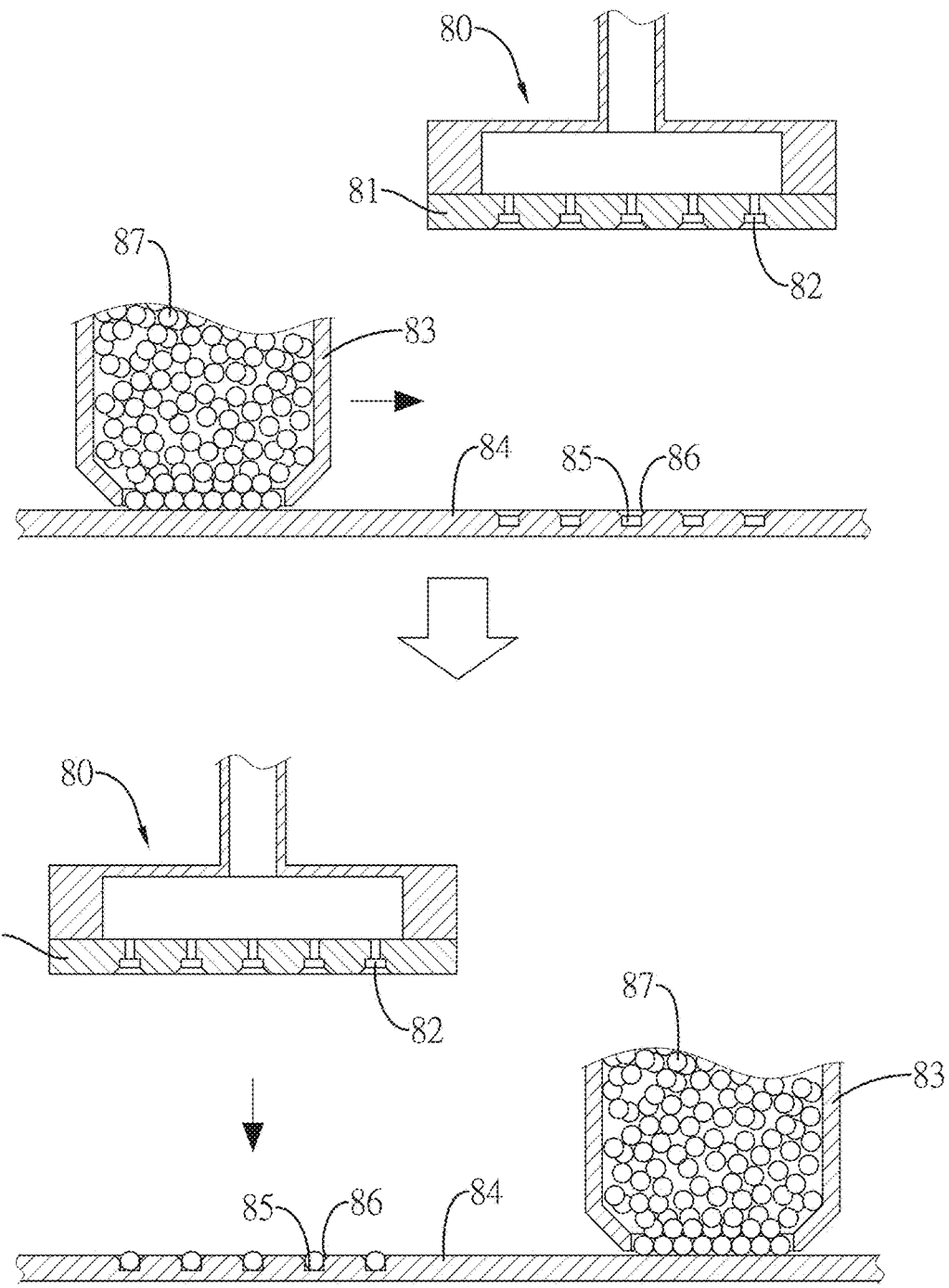
FIG. 10 shows operational side views in partial section of another conventional ball placement device.
Figure 11:
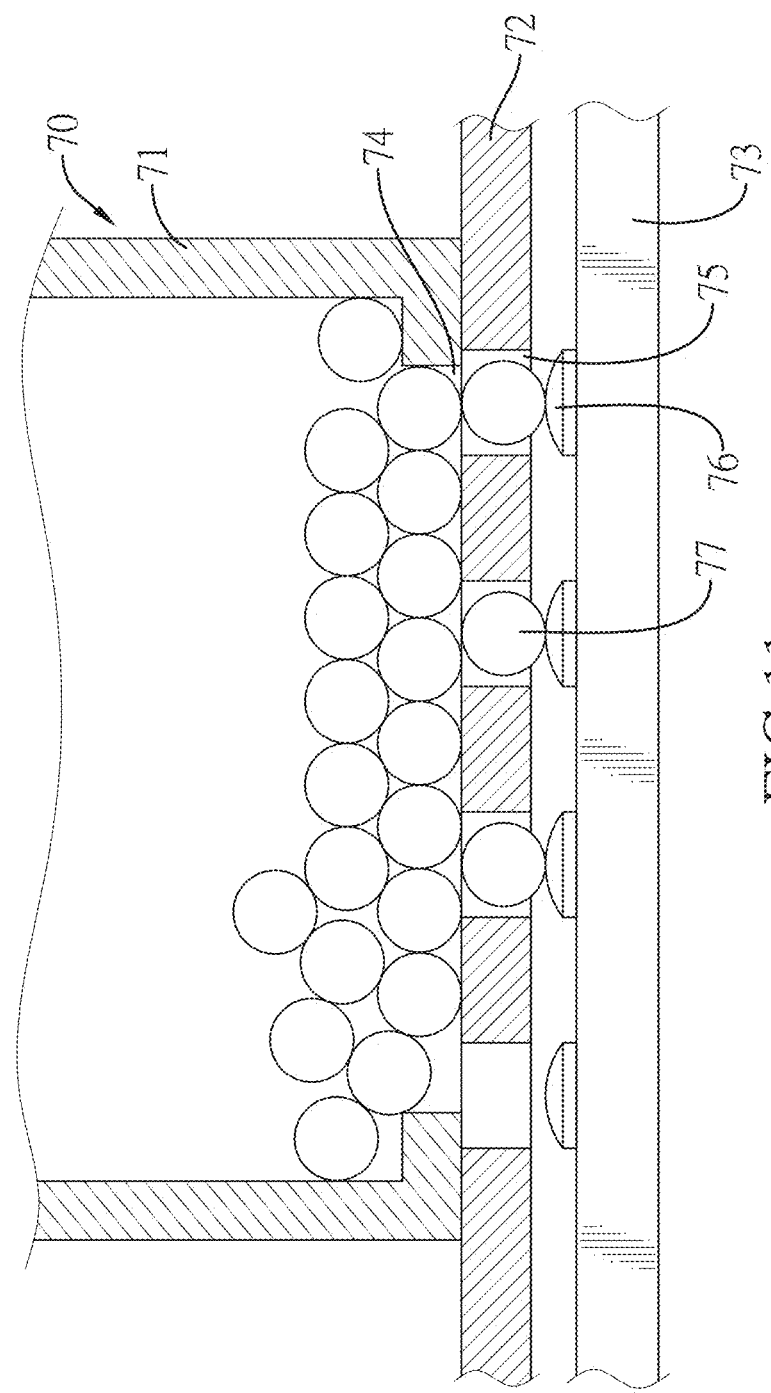
FIG. 11 is an operational side view in partial section of another conventional ball placement device.
Figure 12:
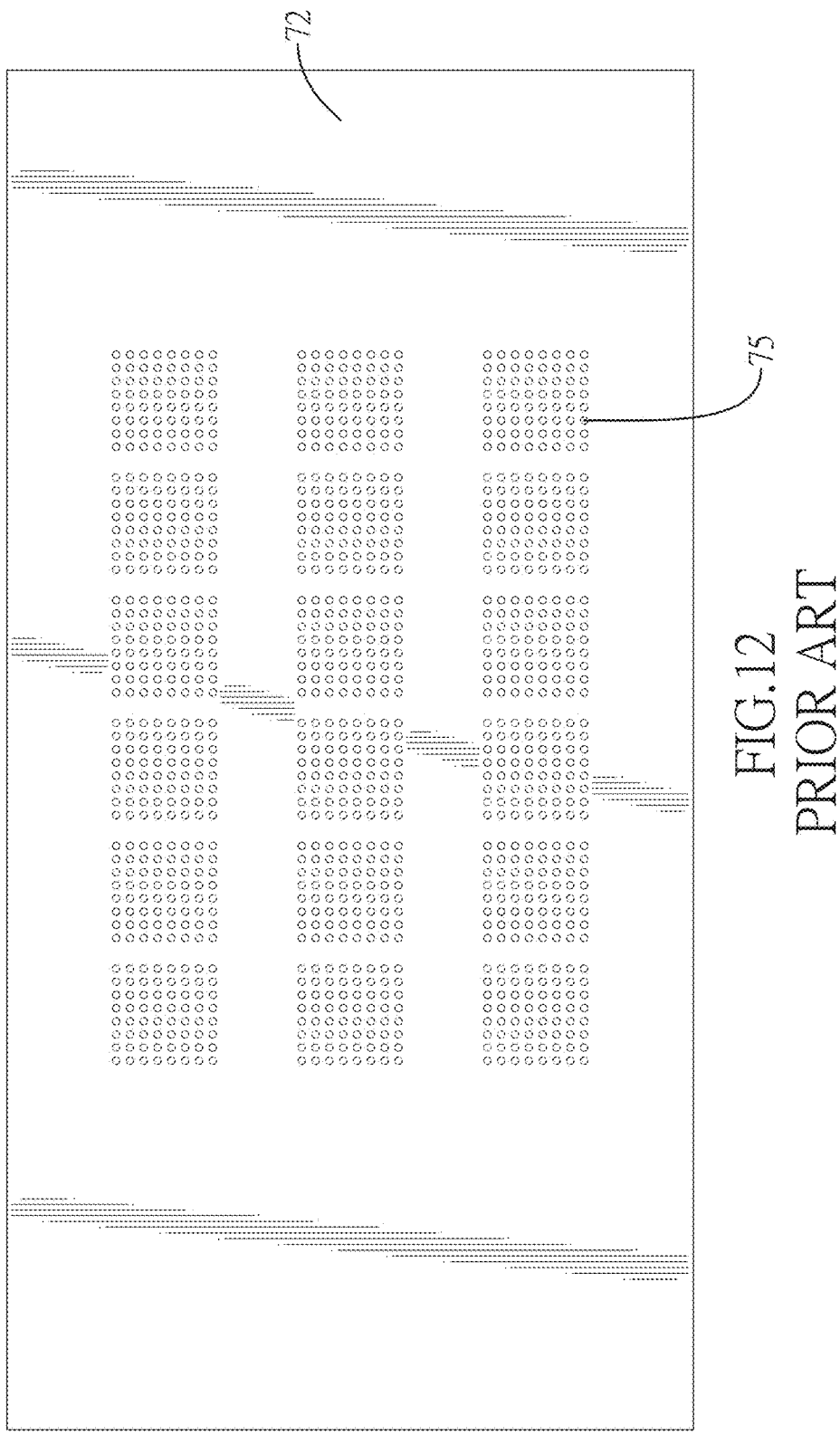
FIG. 12 is a top view of a cover of the conventional ball placement device in FIG. 11.

With reference to FIGS. 1, 6, and 8, in an alternative embodiment, when the guiding board is applied with a suction device, the diameters of the ball-dropping holes 13 are smaller than the diameters of the conducting balls 20. Thus, the conducting balls 20 are held in the ball-dropping holes 13 and can be picked and sucked by a suction device. Accordingly, the probability that the suction device does not suck the conducting balls 20 can be reduced.

In operation, when the ball case is moved relative to the board body 10 in a direction, the suction device can pick the conducting balls 20 from the board body 10 in a first round. After that, the ball case can be moved relative to the board body 10 in a reversed direction, and the suction device can pick the conducting balls 20 in a second round. Accordingly, the ball placement process is efficient.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A guiding board for a ball placement machine comprising
    a board body having
        a top surface;
        a bottom surface;
        a ball-dropping area defined on the top surface; and
        multiple guiding grooves defined in the ball-dropping area and being parallel to each other, wherein each guiding groove has a bottom and multiple ball-dropping holes defined in the bottom and extending through the bottom surface of the board body, wherein the board body further has
        a ball-collecting area defined on the top surface of the board body and located at a position being adjacent to a front end of the ball-dropping area;
        multiple collecting grooves defined in the ball-collecting area and respectively aligned and communicating with the multiple guiding grooves, wherein each collecting groove is formed as a straight line in cooperation with a corresponding one of the guiding grooves;
        a retrieval area defined on the top surface of the board body at a position being adjacent to a rear end of the ball-dropping area; and
        multiple ball-retrieval holes defined in the retrieval area and formed through the top surface and the bottom surface of the board body.

2. The guiding board as claimed in claim 1, wherein the board body further has multiple elongated protrusions formed on and protruding from the top surface of the board body, being parallel to each other, and located respectively between adjacent two of the guiding grooves.

3. The guiding board as claimed in claim 2, wherein each guiding groove has a U-shaped cross section.

4. The guiding board as claimed in claim 1, wherein a distance defined between the bottom of each guiding groove and the bottom surface of the board body is smaller than a distance between the top surface and the bottom surface of the board body.

5. The guiding board as claimed in claim 1, wherein each guiding groove has a U-shaped cross section.

6. The guiding board as claimed in claim 4, wherein the board body further has multiple elongated protrusions formed on and protruding from the top surface of the board body, being parallel to each other, and located respectively between adjacent two of the guiding grooves.

\* \* \* \* \*